United States Patent [19]
Miyaguchi

[11] Patent Number: 5,953,585
[45] Date of Patent: Sep. 14, 1999

[54] METHOD FOR MANUFACTURING AN ORGANIC ELECTROLUMINESCENT DISPLAY DEVICE

[75] Inventor: Satoshi Miyaguchi, Tsurugashima, Japan

[73] Assignee: Pioneer Electric Corporation, Tokyo, Japan

[21] Appl. No.: 08/838,994

[22] Filed: Apr. 23, 1997

[30] Foreign Application Priority Data

Apr. 26, 1996 [JP] Japan ..................................... 8-130790

[51] Int. Cl.[6] ..................................................... H01L 21/00
[52] U.S. Cl. ................................ 438/35; 438/34; 438/99; 257/40; 257/88; 257/89
[58] Field of Search ................................. 438/99, 22, 34, 438/35; 257/40, 88, 89

[56] References Cited

U.S. PATENT DOCUMENTS

| 5,294,870 | 3/1994 | Tang et al. . | |
|---|---|---|---|
| 5,334,539 | 8/1994 | Shinar et al. | 438/99 |
| 5,399,502 | 3/1995 | Friend et al. | 438/99 |
| 5,424,560 | 6/1995 | Norman et al. | 257/40 |
| 5,459,082 | 10/1995 | Jeong | 438/35 |
| 5,721,160 | 2/1998 | Forrest et al. . | |

*Primary Examiner*—Charles Bowers
*Assistant Examiner*—Keith Christianson
*Attorney, Agent, or Firm*—Fish & Richardson P.C.

[57] ABSTRACT

A method for manufacturing an organic electroluminescent display device including one or more organic electroluminescent elements arranged on a light-permeable substrate, each element having a cathode, an emitting layer made of one or more organic substances and an anode is capable of forming, at a high accuracy, an emitting layer with various patterns. The method includes the steps of: layering the anode material with a pattern on a light-permeable substrate; layering secondly in turn the one or more organic substances, the cathode material, the protective layer on the anode material and the light-permeable substrate; layering thirdly a resist layer on the layered protective layer to pattern the layered resist layer with a shape corresponding to the emitting layer; dry-etching the layered anode material, the layered one or more organic substances, the layered cathode material and the layered protective layer in accordance with the pattern of the resist layer; and repeating the second and third layering steps and the dry-etching step to make an arrangement of the one or more organic electroluminescent elements.

6 Claims, 2 Drawing Sheets

EMISSION

METHOD FOR MANUFACTURING AN ORGANIC ELECTROLUMINESCENT DISPLAY DEVICE

BACKGROUND OF THE INVENTION

1. Field of the Invention

The present invention relates to a method for manufacturing an organic electroluminescent (EL) display device using organic electroluminescence elements (the organic EL elements), particularly to make a pattern of emitting portions in the organic EL display device.

2. Description of the Related Art

In conventional emitting elements, there is an electric field emitting element such as an organic electroluminescence (EL) emitting element which has an emitting surface having various patterns such as letters, designs or the like, or a plurality of pixels or the like emitting the same.

FIG. 2 is a schematic cross sectional view of a conventional organic EL display device having organic EL emitting elements. In this figure, the organic EL display device is constructed in such a manner that transparent anodes 102 are formed in turn on a transparent glass substrate 101, and then emitting layers 103 each including organic fluorescent substance layers and an organic hole transport layer or the like are formed in turn with a pattern such as predetermined letters, designs or the like on the transparent anodes 102 by using the pattern-masking and vacuum-depositing method or the like, and then cathodes 104 made of metal are formed with the pattern on the emitting layers 103 by using the pattern-masking and vacuum-depositing method or the like.

In addition, a protective layer 105 is formed on the cathode 104 to prevent the deterioration of the emitting layer 103 and the oxidation of the cathode 104.

In such an organic EL display device, the emitting layer 103 disposed between the cathode 104 and the anode 102 emits light when applied a predetermined voltage across these electrodes by a power supply 106, so that the pattern such as predetermined letters, designs or the like of the emitting layer 103 is displayed through the transparent glass substrate 101.

In recent years, there is in demand for the display apparatus using the organic EL element to be minimized in its pixels and precise shapes of emitting portions thereof in accordance with varieties of information and a high density on the recording medium. Therefore, it is necessary to process the patterns of the emitting layer and the cathode at a high precision in the flexible display panel manufacture.

On the other hand, the pattern-masking and vacuum-depositing method above mentioned is restricted in accuracy of the alignment for the fine mask pattern with the substrate. It is therefore difficult to manufacture, at a high accuracy, the display panel having a plurality of organic EL elements each having a minute pattern.

SUMMARY OF THE INVENTION

Therefore, the present invention has been made to solve such a problem in view of the forgoing status. An object of the invention is to provide a method for manufacturing an organic EL display device capable of forming, at a high accuracy, the emitting layer with various patterns.

In a first aspect of the invention, a method for manufacturing an organic EL display device including one or more organic EL elements arranged on a light-permeable substrate, each element having a cathode, an emitting layer made of one or more organic substances and an anode, comprising the steps of:

layering the anode material with a pattern on a light-permeable substrate;

layering secondly in turn one or more organic substances, the cathode material, the protective layer on said layered anode material and said light-permeable substrate;

layering thirdly a resist layer on said layered protective layer to pattern the layered resist layer with a shape corresponding to said emitting layer;

dry-etching said layered one or more organic substances, said layered cathode material and said layered protective layer in accordance with the pattern of said resist layer; and repeating the second and third layering steps and the dry-etching step to make an arrangement of the one or more organic EL elements.

In a second aspect of the invention of the method for manufacturing an organic EL display device mentioned above, a reactive ion-etching is performed in said dry-etching step of dry-etching said anode material, said one or more organic substances, said cathode material and said protective layer in accordance with the pattern of said resist layer.

According to the invention, the anode material, the one or more organic substances for the emitting layer, the cathode material, the protective layer and the resist layer with the predetermined pattern are layered in turn on the light-permeable substrate. After that, the layered one or more organic substances, the layered cathode material and the layered protective layer are dry-etched in accordance with the pattern of the resist layer. Therefore, the protective layer protects the organic substance from a solvent or water used in the formation of the resist layer without contact thereto, so that no deterioration of the emitting layer occurs. Furthermore, the layers of the organic substance, the cathode and the protective layer are formed or patterned at a high accuracy with various patterns at the same time.

DESCRIPTION OF THE PREFERRED EMBODIMENTS

The invention is made in a manner that, for the purpose of prevention of deterioration in the emitting layer made of organic substances of the organic electroluminescent (EL) element, the emitting layer is previously covered with the protective layer and then the organic substance, the cathode material, the protective layer layered thereon are processed all together by the dry-etching for performing a high accurate patterning. A preferred embodiment according to the invention will be explained with reference to FIGS. 1A to 1J.

FIGS. 1A to 1J show schematic constructive cross-sectional views illustrating a patterning process for making plural emitting layers, plural cathode with a stripe pattern and plural protective layers in a full color organic EL display device including plural organic EL elements and employing a Red, Green, and Blue (RGB) system of the preferred embodiment according to the invention.

Figure 1A:
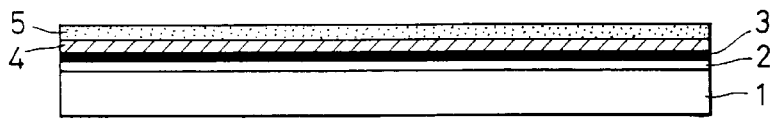
FIGS. 1A to 1J are schematic constructive cross-sectional views illustrating a patterning process for making plural emitting layers, plural cathode with a stripe pattern and plural protective layers in a full color organic EL display device including plural organic EL elements and employing a Red, Green, and Blue (RGB) system of the preferred embodiment according to the invention.

Firstly, as shown in FIG. 1A, anodes 2 of Indium tin oxide (ITO) with a pattern is layered on a light-permeable glass substrate 1. Second, a red color (R) emitting material layer 3, a cathode material layer 4 and a protective layer 5 are in turn layered on the anode 2 and the light-permeable glass substrate 1. The red color (R) emitting material layer 3 is a lamination comprising one or more layers of an organic hole transport layer, an organic fluorescent substance layer and the like for emitting a red light. The protective layer is made of a high density material having a high adhesive strength to the adjacent layer without any damaging the emitting material, the cathode material layers or the like and further having the durability to both the later resist layer patterning and the reactive ion-etching, for example, silicon nitride SiNx (where x denotes an atomic ratio).

Figure 1B:
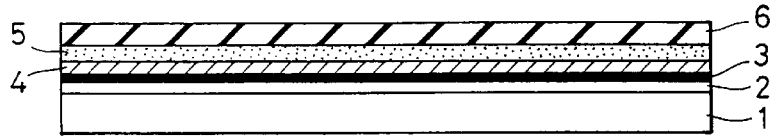
Figure 1C:
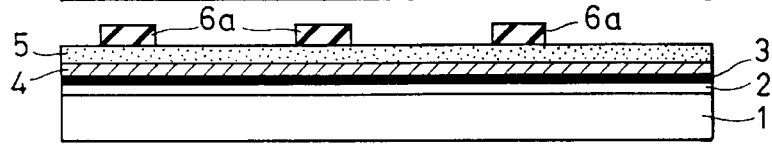

Next, as shown in FIG. 1B, a resist layer 6 is layered on the protective layer 5. After that, as shown in FIG. 1C, the resist layer 6 is patterned by using the photolithography in a such a manner that the R (red color) resist layer 6a correspond to a predetermined red color emitting pattern in the organic EL element. In this case, both the red color (R) emitting material 3 and the cathode material 4 are protected by the protective layer 5. That is, the SiNx protective layer protects the under layers against the alkaline development liquid which is used when the resist layer is patterned by using the photolithography since SiNx is not corroded by the alkaline development liquid. Therefore, aluminum Al having a very low alkaline resistance may be used for the cathode material because of the lack of contact of the cathode material 4 to the alkaline development liquid. There is no damage in the Al cathode 4 during the patterning of the resist layer 6 to 6a. In addition, even though the organic substance of the red color (R) emitting material 3 has very low water resistance, the R emitting layer 3 is sufficiently protected by the protective layer 5 without any peeling off or damage of the red color (R) emitting material 3.

Next, the layers 3, 4, 5 and 6a on the glass substrate 1 shown in FIG. 1C are processed all together by the dry-etching, e.g. a reactive ion-etching excepting the anodes (ITO) 2. In this case, the glass substrate 1 carrying the layers 3, 4, 5 and 6a is disposed parallel to and between both positive and negative electrodes used in the reactive ion-etching (RIE), so that reactive ions emitted from one of the electrodes impinge upon the R (red color) resist layers 6a perpendicular to the substrate and etch the layers. As a result, the red color (R) emitting material 3, the cathode material 4 and the protective layer 5 layered on the anode 2 are etched in accordance with the pattern of the R (red color) resist layers 6a, so that the organic EL elements corresponding to the red color (R) cathodes 4a are patterned (see FIG. 1D).

In addition, various reactive ions are used in the dry-etching. The $CF_4$ gas is used for the protective layer 5 of SiNx. The mixture gas of $BCl_3$ and $Cl_2$ is used for the cathode material 4 of Al. The $O_2$ gas is used for the red color (R) emitting material layer 3 of organic substances. These reactive ion gases etch in turn the layers perpendicular to the surfaces thereof. Therefore, since the reactive ion-etching belongs to anisotropic etching, the side walls of the etched layers are substantially right-angled to the substrate without any undercut as caused by a wet-etching, so that the organic EL elements may be formed even if the R (red color) resist layer 6a has a very minute pattern.

Figure 1D:
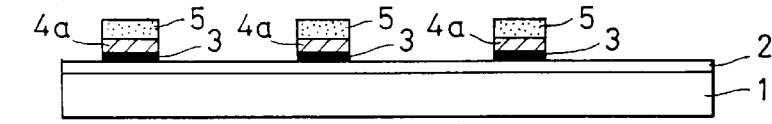

Next, a green color (G) emitting material 7 is layered on the red color organic EL elements formed on the glass substrate 1 shown in FIG. 1D by a similar manner shown in FIG. 1A. The green color (G) emitting material 7 is a lamination comprising one or more layers of an organic hole transport layer, an organic fluorescent substance layer and the like for emitting a green light. After that, the cathode material 4 and the protective layer 5 are in turn layered on the green emitting layer 7. Then, the resist layer 6 is formed on the protective layer 5 by a similar manner shown in FIG. 1B (see FIG. 1E).

Figure 1E:
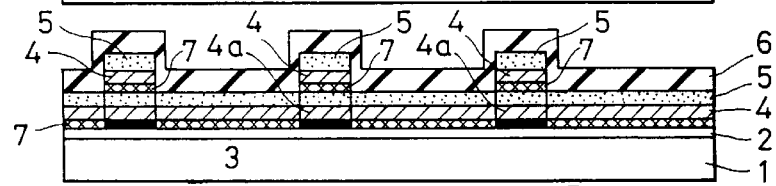
Figure 1F:
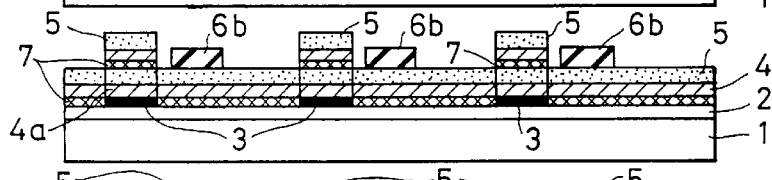

Next, as shown in FIG. 1F, the G (green color) resist layer 6b is formed correspondingly to a predetermined green color emitting pattern in the organic EL element by a similar manner shown in FIG. 1C. After that, as shown in FIG. 1G, the green organic EL elements corresponding to the green color (G) cathodes 4b are patterned by a similar manner shown in FIG. 1D.

Figure 1G:
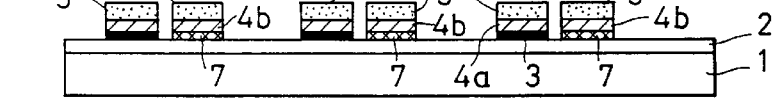
Figure 1H:
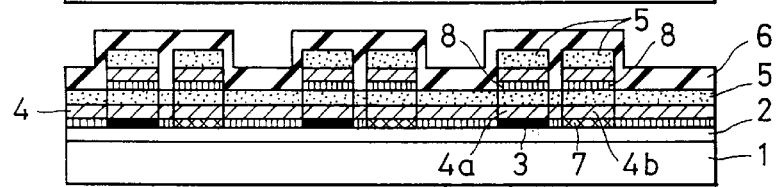
Figure 1I:
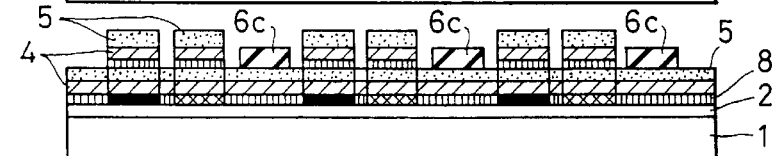
Figure 1J:
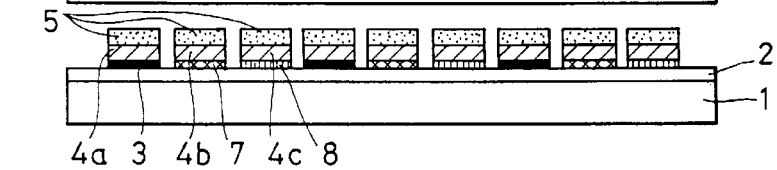
Figure 2:
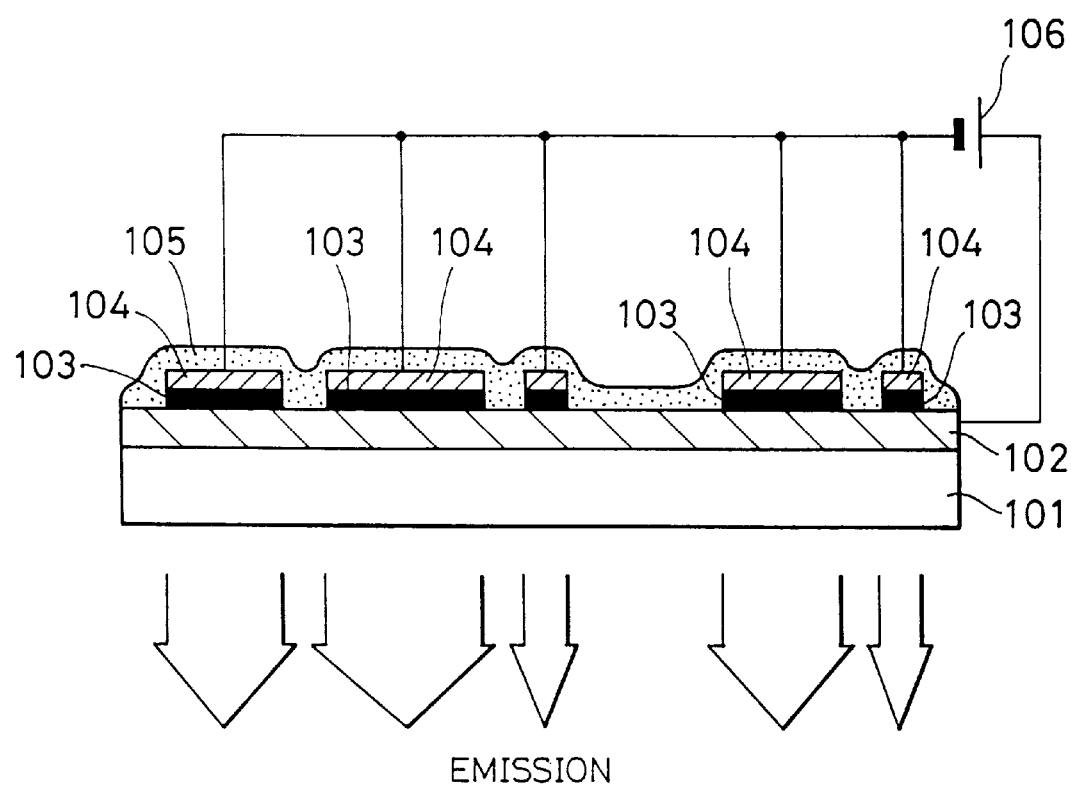
FIG. 2 is a schematic cross sectional view of a conventional organic EL display device.

After that, as shown in FIG. 1H to FIG. 1J, the blue organic EL elements corresponding to the blue color (B) cathodes 4c are patterned by a similar manner shown in FIG. 1E to FIG. 1G in which the blue color (B) emitting material 8 is used instead of the green color (G) emitting material 7. In this way, the blue organic EL elements are formed by repeating the steps shown in FIG. 1E to FIG. 1G using the B (blue color) resist layer 6c corresponding to a predetermined blue color emitting pattern in the organic EL element. As a result, a full color organic EL display device is formed having adjacent parallel striped RGB cathodes including the organic EL elements of the emitting layer, the cathodes, and the protective layer.

In addition to the reactive ion-etching of the above embodiment, another dry-etching may be used for the formation of the layers in the organic EL elements.

In addition to the pattern of the adjacent parallel stripe RGB cathodes of the above embodiment, another cathode pattern with various minute shapes may be employed.

In addition, a protective layer may be formed on the RGB organic EL elements including the anodes and the substrate to prevent the deterioration of the emitting layer and the oxidation of the cathode.

According to the invention, after layering in turn the anode material, the organic substance for the emitting layer, the cathode material, the protective layer on the light-permeable substrate, the resist layer with the predetermined shape is formed on the layered protective layer. After that, the layered emitting layer, the layered cathode material and the layered protective layer are dry-etched all together in accordance with the pattern of the resist layer. Therefore, the protective layer protects the emitting layer against a solvent or water used in the formation of the resist layer without contact thereto, so that no deterioration of the emitting layer occurs. Furthermore, the layers of the organic substance, the cathode and the protective layer are formed or patterned at a high accuracy with various patterns at the same time.

What is claimed is:

1. A method for manufacturing an organic electroluminescent display device comprising:
   overlaying a light permeable substrate with an anodic material;
   overlaying the anodic material with at least one first organic electroluminescent material;
   overlaying the first organic electroluminescent material with a cathodic material;
   overlaying the cathodic material with a protective material;
   overlaying the protective material with a photoresist material;
   etching a pattern in the photoresist material;
   etching the device to remove the protective material, the cathodic material, and the first organic electroluminescent material in accordance with the pattern in the photoresist material;

overlaying the device with at least one second organic electroluminescent material;

overlaying the second organic electroluminescent material with a cathodic material;

overlaying the cathodic material with a protective material;

overlaying the protective material with a photoresist material;

etching a pattern in the photoresist material;

etching the device to remove the protective material, the cathodic material, and the second organic electroluminescent material in accordance with the pattern in the photoresist material;

overlaying the device with at least one third organic electroluminescent material;

overlaying the third organic electroluminescent material with a cathodic material;

overlaying the cathodic material with a protective material;

overlaying the protective material with a photoresist material;

etching a pattern in the photoresist material; and etching the device to remove the protective material, the cathodic material, and the third organic electroluminescent material in accordance with the pattern in the photoresist material;

wherein:
    etching a pattern in the photoresist material is done with an alkaline liquid; and
    the protective material prevents the alkaline liquid from damaging the cathodic material, the first organic electroluminescent material, the anodic material, and the light permeable substrate.

2. A method for manufacturing an organic electroluminescent display device comprising:

overlaying a light permeable substrate with an anodic material;

overlaying the anodic material with at least one first organic electroluminescent material;

overlaying the first organic electroluminescent material with a cathodic material;

overlaying the cathodic material with a protective material;

overlaying the protective material with a photoresist material;

etching a pattern in the photoresist material;

etching the device to remove the protective material, the cathodic material, and the first organic electroluminescent material in accordance with the pattern in the photoresist material;

overlaying the device with at least one second organic electroluminescent material;

overlaying the second organic electroluminescent material with a cathodic material;

overlaying the cathodic material with a protective material;

overlaying the protective material with a photoresist material;

etching a pattern in the photoresist material;

etching the device to remove the protective material, the cathodic material, and the second organic electroluminescent material in accordance with the pattern in the photoresist material;

overlaying the device with at least one third organic electroluminescent material;

overlaying the third organic electroluminescent material with a cathodic material;

overlaying the cathodic material with a protective material;

overlaying the protective material with a photoresist material;

etching a pattern in the photoresist material; and etching the device to remove the protective material, the cathodic material, and the third organic electroluminescent material in accordance with the pattern in the photoresist material;

wherein:
    etching a pattern in the photoresist material is done with an alkaline liquid;
    the protective material prevents the alkaline liquid from damaging the cathodic material, the first organic electroluminescent material, the anodic material, and the light permeable substrate; and
    the protective material prevents the alkaline liquid from damaging the second organic electroluminescent material.

3. A method for manufacturing an organic electroluminescent display device comprising:

overlaying a light permeable substrate with an anodic material;

overlaying the anodic material with at least one first organic electroluminescent material;

overlaying the first organic electroluminescent material with a cathodic material;

overlaying the cathodic material with a protective material;

overlaying the protective material with a photoresist material;

etching a pattern in the photoresist material;

etching the device to remove the protective material, the cathodic material, and the first organic electroluminescent material in accordance with the pattern in the photoresist material;

overlaying the device with at least one second organic electroluminescent material;

overlaying the second organic electroluminescent material with a cathodic material;

overlaying the cathodic material with a protective material;

overlaying the protective material with a photoresist material;

etching a pattern in the photoresist material;

etching the device to remove the protective material, the cathodic material, and the second organic electroluminescent material in accordance with the pattern in the photoresist material;

overlaying the device with at least one third organic electroluminescent material;

overlaying the third organic electroluminescent material with a cathodic material;

overlaying the cathodic material with a protective material;

overlaying the protective material with a photoresist material;

etching a pattern in the photoresist material; and etching the device to remove the protective material, the cathodic material, and the third organic electroluminescent material in accordance with the pattern in the photoresist material;

wherein:

etching a pattern in the photoresist material is done with an alkaline liquid;

the protective material prevents the alkaline liquid from damaging the cathodic material; the first organic electroluminescent material, the anodic material, and the light permeable substrate;

the protective material prevents the alkaline liquid from damaging the second organic electroluminescent material; and the protective material prevents the alkaline liquid from damaging the third organic electroluminescent material.

4. A method for manufacturing an organic electroluminescent display device comprising:

overlaying a light permeable substrate with an anodic material;

overlaying the anodic material with at least one first organic electroluminescent material;

overlaying the first organic electroluminescent material with a cathodic material;

overlaying the cathodic material with a protective material;

overlaying the protective material with a photoresist material;

etching a pattern in the photoresist material;

etching the device to remove the protective material, the cathodic material, and the first organic electroluminescent material in accordance with the pattern in the photoresist material;

overlaying the device with at least one second organic electroluminescent material;

overlaying the second organic electroluminescent material with a cathodic material;

overlaying the cathodic material with a protective material;

overlaying the protective material with a photoresist material;

etching a pattern in the photoresist material;

etching the device to remove the protective material, the cathodic material, and the second organic electroluminescent material in accordance with the pattern in the photoresist material;

overlaying the device with at least one third organic electroluminescent material;

overlaying the third organic electroluminescent material with a cathodic material;

overlaying the cathodic material with a protective material;

overlaying the protective material with a photoresist material;

etching a pattern in the photoresist material; and etching the device to remove the protective material, the cathodic material, and the third organic electroluminescent material in accordance with the pattern in the photoresist material;

wherein:

etching a pattern in the photoresist material is done with an alkaline liquid;

the protective material prevents the alkaline liquid from damaging the cathodic material; the first organic electroluminescent material, the anodic material, and the light permeable substrate; and the protective material is a silicon nitride.

5. A method for manufacturing an organic electroluminescent display device comprising:

overlaying a light permeable substrate with an anodic material;

overlaying the anodic material with at least one first organic electroluminescent material;

overlaying the first organic electroluminescent material with a cathodic material;

overlaying the cathodic material with a protective material;

overlaying the protective material with a photoresist material;

etching a pattern in the photoresist material;

etching the device to remove the protective material, the cathodic material, and the first organic electroluminescent material in accordance with the pattern in the photoresist material;

overlaying the device with at least one second organic electroluminescent material;

overlaying the second organic electroluminescent material with a cathodic material;

overlaying the cathodic material with a protective material;

overlaying the protective material with a photoresist material;

etching a pattern in the photoresist material;

etching the device to remove the protective material, the cathodic material, and the second organic electroluminescent material in accordance with the pattern in the photoresist material;

overlaying the device with at least one third organic electroluminescent material;

overlaying the third organic electroluminescent material with a cathodic material;

overlaying the cathodic material with a protective material;

overlaying the protective material with a photoresist material;

etching a pattern in the photoresist material; and etching the device to remove the protective material, the cathodic material, and the third organic electroluminescent material in accordance with the pattern in the photoresist material;

wherein:

etching a pattern in the photoresist material is done with an alkaline liquid;

the protective material prevents the alkaline liquid from damaging the cathodic material; the first organic electroluminescent material, the anodic material, and the light permeable substrate; and the cathodic material is aluminum.

6. A method for manufacturing an organic electroluminescent display device comprising:

overlaying a glass substrate with indium tin oxide;

overlaying the indium tin oxide with at least one red-emitting organic electroluminescent material;

overlaying the red-emitting organic electroluminescent material with aluminum;

overlaying the aluminum with a silicon nitride;

overlaying the silicon nitride with a photoresist material;

wet-etching a pattern in the photoresist material with an alkaline liquid, wherein the silicon nitride prevents the alkaline liquid from damaging the aluminum, the red-emitting organic electroluminescent material, the indium tin oxide, and the glass substrate;

dry-etching the device to remove the silicon nitride, the aluminum, and the red-emitting organic electroluminescent material in accordance with the pattern in the photoresist material;

overlaying the device with at least one green-emitting organic electroluminescent material;

overlaying the green-emitting organic electroluminescent material with aluminum;

overlaying the aluminum with a silicon nitride;

overlaying the silicon nitride with a photoresist material;

wet-etching a pattern in the photoresist material with an alkaline liquid, wherein the silicon nitride prevents the alkaline liquid from damaging the aluminum, the red-emitting organic electroluminescent material, the green-emitting organic electroluminescent material, the indium tin oxide, and the glass substrate;

dry-etching the device to remove the silicon nitride, the aluminum, and the green-emitting organic electroluminescent material in accordance with the pattern in the photoresist material;

overlaying the device with at least one blue-emitting organic electroluminescent material;

overlaying the blue-emitting electroluminescent material with aluminum;

overlaying the aluminum with a silicon nitride;

overlaying the silicon nitride with a photoresist material;

wet-etching a pattern in the photoresist material with an alkaline liquid, wherein the silicon nitride prevents the alkaline liquid from damaging the aluminum, the red-emitting organic electroluminescent material, the green-emitting organic electroluminescent material, the blue-emitting organic electroluminescent material, the indium tin oxide, and the glass substrate;

dry-etching the device to remove the silicon nitride, the aluminum, and the blue-emitting organic electroluminescent material in accordance with the pattern in the photoresist material; and overlaying the device with a protective layer which prevents oxidation of the aluminum and prevents deterioration of the red-emitting organic electroluminescent material, the green-emitting organic electroluminescent material, and the blue-emitting organic electroluminescent material.

\* \* \* \* \*